(12) United States Patent
Wu et al.

(10) Patent No.: US 9,024,281 B2
(45) Date of Patent: May 5, 2015

(54) METHOD FOR DUAL ENERGY IMPLANTATION FOR ULTRA-SHALLOW JUNCTION FORMATION OF MOS DEVICES

(71) Applicant: Semiconductor Manufacturing International (Shanghai) Corporation, Shanghai (CN)

(72) Inventors: Hanming Wu, Shanghai (CN); Chia Hao Lee, Shanghai (CN); John Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/906,897

(22) Filed: May 31, 2013

(65) Prior Publication Data

US 2013/0264491 A1    Oct. 10, 2013

Related U.S. Application Data

(62) Division of application No. 12/830,241, filed on Jul. 2, 2010, now Pat. No. 8,466,050.

(30) Foreign Application Priority Data

Jul. 3, 2009    (CN) .......................... 2009 1 0054410

(51) Int. Cl.
   *H01J 37/317*    (2006.01)
   *H01J 37/30*    (2006.01)
   (Continued)

(52) U.S. Cl.
   CPC ......... *H01J 37/3171* (2013.01); *H01J 37/3007* (2013.01); *H01J 2237/055* (2013.01);
   (Continued)

(58) Field of Classification Search
   CPC . H01J 37/3171; H01J 37/3007; H01J 37/147; H01J 27/3007; H01J 37/1475; G21K 1/08
   USPC ........ 250/492.2, 492.21, 492.3, 396 ML, 398
   See application file for complete search history.

(56) References Cited

U.S. PATENT DOCUMENTS 4,276,477 A * 6/1981 Enge ............................. 250/398
4,804,852 A * 2/1989 Rose et al. .................. 250/492.1
(Continued)

FOREIGN PATENT DOCUMENTS

CN    1684237 A    10/2005
CN    1983529 A    6/2007
(Continued)

OTHER PUBLICATIONS

Definition of "substantial," Merriam-Webster's Dictionary 2012, accessible online at http://www.merriam-webster.com/dictionary/substantial.
(Continued)

*Primary Examiner* — Nicole Ippolito
*Assistant Examiner* — Wyatt Stoffa
(74) *Attorney, Agent, or Firm* — Kilpatrick Townsend & Stockton LLP

(57) ABSTRACT

An apparatus for implanting ions of a selected species into a semiconductor wafer includes an ion source, an accelerator, and an magnetic structure. The ion source is configured to generate an ion beam. The accelerator is configured to accelerate the ion beam, where the accelerated ion beam includes at least a first portion having a first energy and a second portion having a second energy. The magnetic structure is configured to deflect the first portion of the accelerated ion beam in a first path trajectory and the second portion of the accelerated ion beam in a second path trajectory. The first and second path trajectories have a same incident angle relative to a surface region of the semiconductor wafer.

16 Claims, 6 Drawing Sheets

(51) Int. Cl.
  *H01L 21/223*   (2006.01)
  *H01L 21/265*   (2006.01)
  *H01L 29/08*    (2006.01)
  *H01L 29/66*    (2006.01)
  *H01L 29/78*    (2006.01)

(52) U.S. Cl.
  CPC ..... *H01J2237/0825* (2013.01); *H01L 21/2236* (2013.01); *H01L 21/26513* (2013.01); *H01L 29/0847* (2013.01); *H01L 29/6659* (2013.01); *H01L 29/7833* (2013.01)

(56) References Cited

U.S. PATENT DOCUMENTS

| | | | |
|---|---|---|---|
| 5,438,203 A * | 8/1995 | Glavish et al. | 250/396 ML |
| 5,569,362 A * | 10/1996 | Lerbet et al. | 204/192.16 |
| 5,767,522 A * | 6/1998 | Kodama | 250/492.21 |
| 5,895,955 A | 4/1999 | Gardner et al. | |
| 6,051,865 A | 4/2000 | Gardner et al. | |
| 6,114,210 A | 9/2000 | Wu et al. | |
| 6,232,164 B1 | 5/2001 | Tsai et al. | |
| 6,734,446 B1 * | 5/2004 | Yamazaki et al. | 250/492.21 |
| 8,466,050 B2 * | 6/2013 | Wu et al. | 438/514 |
| 2001/0020723 A1 | 9/2001 | Gardner et al. | |
| 2002/0019104 A1 | 2/2002 | Miyagi | |
| 2002/0153562 A1 | 10/2002 | Lee et al. | |
| 2005/0142785 A1 | 6/2005 | Bang | |
| 2007/0249151 A1 | 10/2007 | Kadoya | |
| 2008/0006887 A1 | 1/2008 | Ueno et al. | |
| 2008/0237690 A1 | 10/2008 | Anezaki et al. | |
| 2008/0242039 A1 | 10/2008 | Ku et al. | |
| 2010/0243879 A1 * | 9/2010 | Huang et al. | 250/396 ML |
| 2012/0021592 A1 * | 1/2012 | Yamazaki et al. | 438/515 |
| 2012/0126147 A1 * | 5/2012 | Cherekdjian | 250/492.21 |

FOREIGN PATENT DOCUMENTS

| | | |
|---|---|---|
| JP | H10-256175 A | 9/1998 |
| WO | 2008/050071 A2 | 5/2008 |

OTHER PUBLICATIONS

Restriction Requirement for U.S. Appl. No. 12/830,241 mailed Nov. 28, 2011, 9 pages.
Non-Final Office Action for U.S. Appl. No. 12/830,241 mailed Jan. 20, 2012, 18 pages.
Final Office Action for U.S. Appl. No. 12/830,241 mailed Jul. 20, 2012, 21 pages.
Non-Final Office Action for U.S. Appl. No. 12/830,241 mailed Oct. 5, 2012, 21 pages.
Notice of Allowance for U.S. Appl. No. 12/830,241 mailed Feb. 20, 2013, 8 pages.

* cited by examiner

METHOD FOR DUAL ENERGY IMPLANTATION FOR ULTRA-SHALLOW JUNCTION FORMATION OF MOS DEVICES

CROSS-REFERENCES TO RELATED APPLICATIONS

This application is a divisional application of U.S. patent application Ser. No. 12/830,241, filed Jul. 2, 2010, which claims priority to Chinese Patent Application No. 200910054410.3, filed Jul. 3, 2009, entitled "Method of and Apparatus for Forming a Lightly Doped Drain" by inventors Hanming Wu, Chia Hao Lee, and John Chen, both of which are commonly assigned and incorporated by reference herein for all purposes.

BACKGROUND OF THE INVENTION

The present invention is directed to integrated circuits and their processing for the manufacture of semiconductor devices. More particularly, the invention provides a method and structures for manufacturing MOS devices using a multi-energy implantation technique for ultra-shallow junction advanced MOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, as the lateral dimensions of the MOS devices become smaller, the vertical dimensions must also be reduced, and difficulties arise in forming implanted regions such as lightly doped drain (LDD) regions for MOS devices. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using a multi-energy implantation technique for ultra-shallow junction advanced MOS integrated circuit devices. But it would be recognized that the invention has a much broader range of applicability.

In an embodiment, the present invention provides a method for forming a CMOS semiconductor integrated circuit device. The method includes providing a semiconductor substrate, which has at least a surface region. The method forms a gate dielectric layer (e.g., silicon dioxide, silicon nitride, silicon oxynitride) overlying the surface region of the semiconductor substrate, the gate dielectric layer having a thickness of less than 10 nanometers. The method forms a gate layer (e.g., polysilicon, doped polysilicon, in-situ doped polysilicon) overlying the gate dielectric layer. The method patterns the gate layer to form a gate structure including a first edge and a second edge. In a preferred embodiment, the gate structure has a width of 90 nanometers and less or 65 nanometers and less. The method includes a multi-step and multi-energy implantation process. The method implants a selected species at a first depth using the gate structure as a mask for a lightly doped drain (LDD) region. The first depth is a predetermined first depth from the surface region. The method forms a dielectric layer overlying the gate structure to protect the gate structure including the first edge and the second edge. The method further implants the selected species at a second depth for forming a source and drain regions using the dielectric layer as a mask. The second depth is a predetermined second depth from the surface region. The method diffuses the selected species using a thermal treatment process and forms a source region and a drain region for an MOS device structure. In preferred embodiments, a channel region underlying the gate structure is in a compressed and/or tensile state, depending upon the embodiment.

In an embodiment, a method for implanting ions of a selected species into a semiconductor wafer includes generating an ion beam from an ion source and accelerating the ion beam, wherein the act of accelerating includes accelerating a first portion of the ion beam using a first energy and accelerating a second portion of the ion beam using a second energy. The method further includes deflecting the first and second portions of the ion beam in the same trajectory direction, which is perpendicular to the surface of the semiconductor wafer. In an embodiment, the first energy is higher than the second energy, and the deflection of the first and second portions of the ion beam occurs concurrently. In another embodiment, the first portion of the ion beam is deflected according to a first path trajectory having a first trajectory angle and the second portion of the ion beam is deflected according to a second path trajectory having a second trajectory angle, wherein the first trajectory angle is greater than the second trajectory angle.

In another embodiment, the present invention provides an apparatus for implanting ions of a selected species into a semiconductor substrate. The apparatus includes an ion source configured to generate an ion beam and an accelerator configured to accelerate the ion beam, wherein the accelerated ion beam includes at least a first accelerated beam portion having a first energy and a second accelerated beam portion having a second energy. The apparatus further includes a magnetic structure configured to deflect the first beam portion into a first path trajectory having a first trajectory angle and the second beam portion into a second path trajectory having a second trajectory angle. In an embodiment, the first and second path trajectories have the same incident angle into a surface of the semiconductor substrate.

In a specific embodiment, the first trajectory angle is greater than the second trajectory angle.

In some embodiments of the above apparatus, the incident angle is perpendicular to the surface of the semiconductor wafer. In another embodiment, the first energy is greater than the second energy. In another embodiment, the magnetic structure is configured to concurrently deflect the first accelerated ion portion into a first path trajectory having a first deflected angle and the second accelerated ion portion into a second path trajectory having a second deflected angle. The first deflected angle is greater than the second deflected angle, and the first and second deflected path trajectories travel in a same direction relative to the surface of the semiconductor wafer.

In some embodiments of the above apparatus, the first portion of the ion bean has a dose that is about 1 to 3 times higher than the dose of the second portion of the ion beam. In another embodiment, the dose of the first portion of the ion bean is substantially equal to the dose of the second portion of the ion bean, and the second energy is about 10 times higher than the first energy. In another embodiment, the first energy is about 50 eV and the first dose is from about $1 \times 10^{15}$ atoms/cm$^2$ to about $3 \times 10^{15}$ atoms/cm$^2$, and the second energy is about 500 eV and the second dose is about $1 \times 10^{15}$ atoms/cm$^2$. In another embodiment, the ion beam comprises n-type dopants. In another embodiment, the ion beam comprises p-type dopants. In another embodiment, the ion beam is selected from the group consisting of phosphorous (P), arsenic (As), and antimony (Sb).

In yet another embodiment, the present invention provides a method for forming a lightly doped drain (LDD) region. The method includes providing a semiconductor substrate having a surface region, generating an ion beam of a selected species, and accelerating the ion beam, wherein the accelerated ion beam includes a first accelerated beam portion and a second accelerated beam portion. The method further includes deflecting the accelerated ion beam, wherein the first and second accelerated portions are concurrently deflected away from an initial path to a first path trajectory and a second path trajectory having a first deflected angle and a second deflected angle, respectively. In an embodiment, the first and second path trajectories have the same path direction, which is perpendicular to the surface region of the semiconductor wafer. In another embodiment, the first deflected angle is greater than the second deflected angle. In yet another embodiment, the selected species may include an n-type ion comprising phosphorous (P), arsenic (As), or antimony (Sb).

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less using low dosage implantation techniques. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
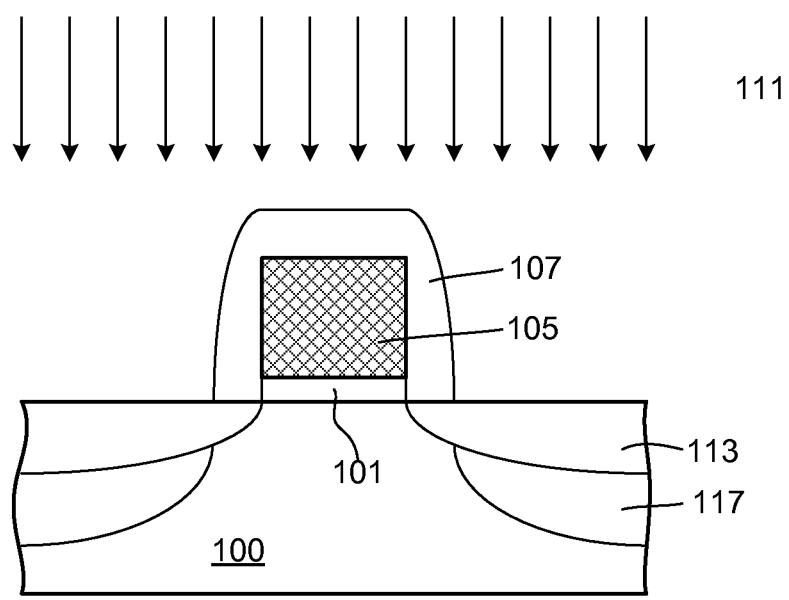
FIG. 1 is a simplified cross-sectional view diagram of a MOS device according to an embodiment of the present invention.

According to the present invention, techniques for processing integrated circuits for the manufacture of semiconductor devices are provided. More particularly, the invention provides a method and structures for manufacturing MOS devices using a multi-energy implantation technique for ultra-shallow junction advanced MOS integrated circuit devices. But it would be recognized that the invention has a much broader range of applicability.

As device feature size shrinks, shallow junction needs extra-low energy ion implantation for LDD process. However, the current single-harmonic-like ion energy distribution function (IEDF) implantation does not meet the requirements of 65 nm technology node and beyond. By using a two peak IEDF plasma implantation, device parameters can be improved significantly. In addition, a dual-energy ion beam can also be used in ultra-low energy implantation to improve device performance.

As indicated in TCAD simulation, a two-peak IEDF ion implantation is a promising approach to low energy implant to meet the requirement of 90 nm and 65 nm technology nodes. The low energy component in IEDF would be helpful in improving device performance, such as decreasing Ioff/Idsat ratio. Details of embodiments of the present invention can be found throughout the present specification and more particularly below.

A method for fabricating a CMOS integrated circuit device according to an embodiment of the present invention may be outlined as follows:

1. Provide a semiconductor substrate, e.g., silicon wafer, silicon on insulator;

2. Form a gate dielectric layer (e.g., silicon dioxide or silicon nitride) overlying the semiconductor substrate, wherein the first dielectric layer being less than 10 nanometers;

3. Form a gate layer (e.g., polysilicon, metal) overlying the gate dielectric layer;

4. Pattern the gate layer to form a gate structure including edges (e.g., a plurality of sides or edges);

5. Implant a selected species to a first predetermined depth to form lightly doped drain regions;

6. Form a dielectric layer overlying the gate structure to protect the gate structure including the edges;

7. Form sidewall spacers overlying the patterned gate layer

8. Implant the selected species to a second predetermined depth;

9. Perform thermal treatment on the substrate, including implanted species;

10. Etch a source region and a drain region adjacent to the gate structure using the gate structure as a mask;

11. Deposit a silicon germanium material into the source region and the drain region to fill the etched source region and the etched drain region;

12. Cause a channel region between the source region and the drain region to be strained in compressive mode from at least the silicon germanium material formed in the source region and the drain region, wherein the channel region is about the same width as the patterned gate layer; and 13. Perform other steps, as desired.

The above sequence of steps provides a method according to an embodiment of the present invention. As shown, the method uses a combination of steps including a way of forming a CMOS integrated circuit device using a multi-step and multi-energy implantation technique. Other alternatives can also be provided where steps are added, one or more steps are removed, or one or more steps are provided in a different sequence without departing from the scope of the claims herein. Further details of the present method can be found throughout the present specification and more particularly below.

FIG. 1 is a simplified cross-sectional view diagram of a MOS device according to an embodiment of the present invention. This diagram is merely an example, which should not unduly limit the scope of the claims herein. One of ordinary skill in the art would recognize many variations, alternatives, and modifications. In a specific embodiment, the present invention provides a method for forming a CMOS semiconductor integrated circuit devices. The method includes providing a semiconductor substrate 100, which has at least a surface region. The method forms a gate dielectric layer 101 (e.g., silicon dioxide, silicon nitride, silicon oxynitride) overlying the surface region of the semiconductor substrate, the gate dielectric layer being less than 10 nanometers. The method forms a gate layer (e.g., polysilicon, doped polysilicon, in-situ doped polysilicon) overlying the dielectric layer. The method patterns the gate layer to form a gate structure 105 including a first edge and a second edge.

In a preferred embodiment, the gate structure has a width of 90 nanometers and less or 65 nanometers and less. The method performs a multi-step implantation process 111. The method implants a selected species at first depth 113 using the gate structure as a masking layer for a lightly doped drain region (LDD). The first depth is a predetermined first depth from the surface region.

The method forms a dielectric layer 107 overlying the gate structure to protect the gate structure including the first edge and the second edge. The method implants the selected species at a second depth 117. The second depth is a predetermined second depth from the surface region. For an NMOS device, the selected species may be an n-type dopant such as phosphorous (P) pr arsenic (As). For a PMOS device, the selected may be a p-type ion dopant such as boron (B). Depending upon the embodiment, there also can be other implanting processes. Of course, one of ordinary skill in the art would recognize many variations, modifications, and alternatives. Further details of the implantation processes can be found throughout the present specification and more particularly below.

Figure 2:
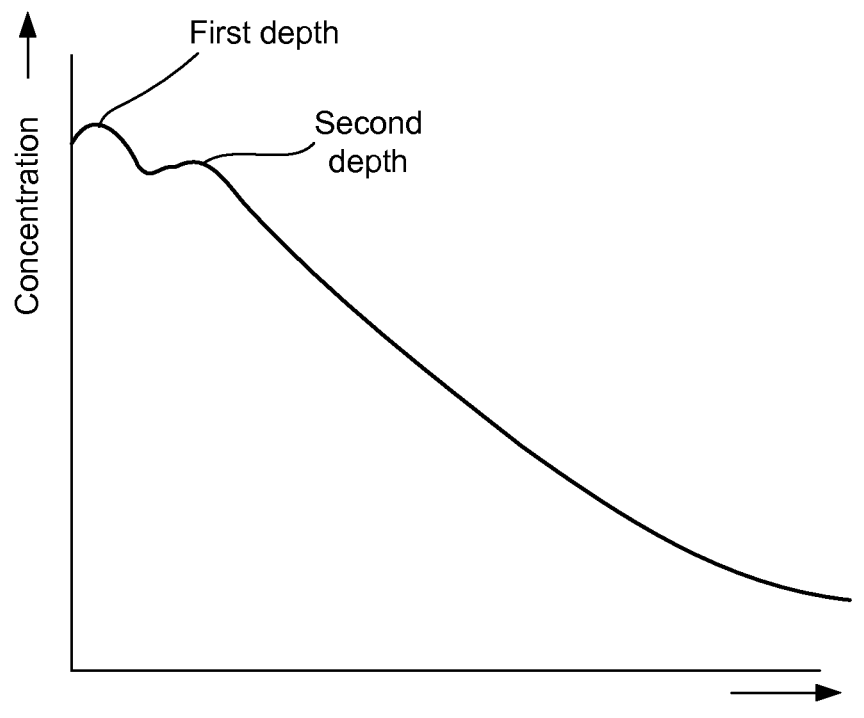
FIG. 2 is a simplified plot of ion concentration against the depth for the MOS device according to an embodiment of the present invention.

FIG. 2 is a simplified plot of concentration against depth for the MOS device according to an embodiment of the present invention. This diagram is merely an example, which should not unduly limit the scope of the claims herein. One of ordinary skill in the art would recognize many variations, alternatives, and modifications.

The method diffuses the first species using a thermal treatment process and forms source/drain regions for an MOS device structure. In preferred embodiments, a channel region underlying the gate structure is in a compressed and/or tensile state, depending upon the embodiment.

Figure 3:
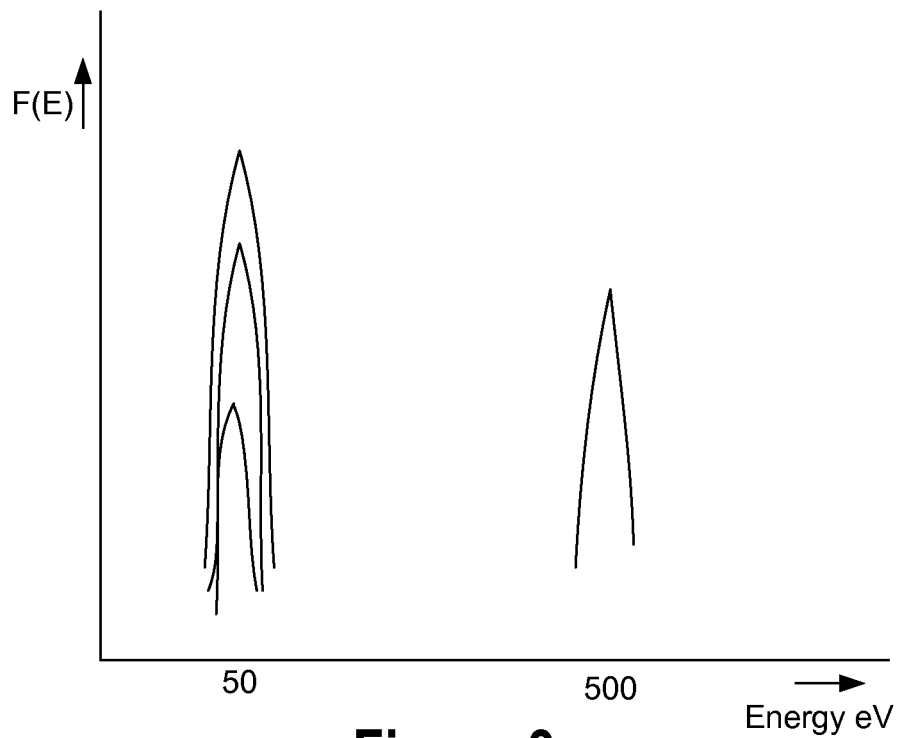
FIG. 3 is a simplified diagram of plot of an ion energy distribution function of dual energy beam implantation according to an embodiment of the present invention.

FIG. 3 is a simplified diagram of a plot of ion energy distribution function (IEDF) of dual energy beam implantation according to an embodiment of the present invention. This diagram is merely an example and should not unduly limit the scope of the claims herein. One of ordinary skill in the art would recognize many variations, modifications, and alternatives. A preliminary ion energy distribution function (IEDF) is shown in FIG. 3. Both low-energy component and energetic component of IEDF can be adjusted.

For fair comparison, device performance for a same implant dose for 500 eV ions in a dual energy beam implant and for 2 keV ions in conventional implant was measured. The dose of low-energy component in the dual energy beam implant is allowed to vary by a factor of one to three. In present work we used a Monte Carlo simulation method to calculate the dopant distribution profile for an LDD implant condition with varying doses at energies of 50 eV and 500 eV. The present dual energy implant and a conventional implant are compared by means of device simulation. Due to low implant energy of 50 eV, the dopant peak is located at a depth of about 10 Å. The oxide grown at the polysilicon re-oxidation step in source drain extension (SDE) regions is removed after a HALO implant and before LDD implant.

Figure 4:
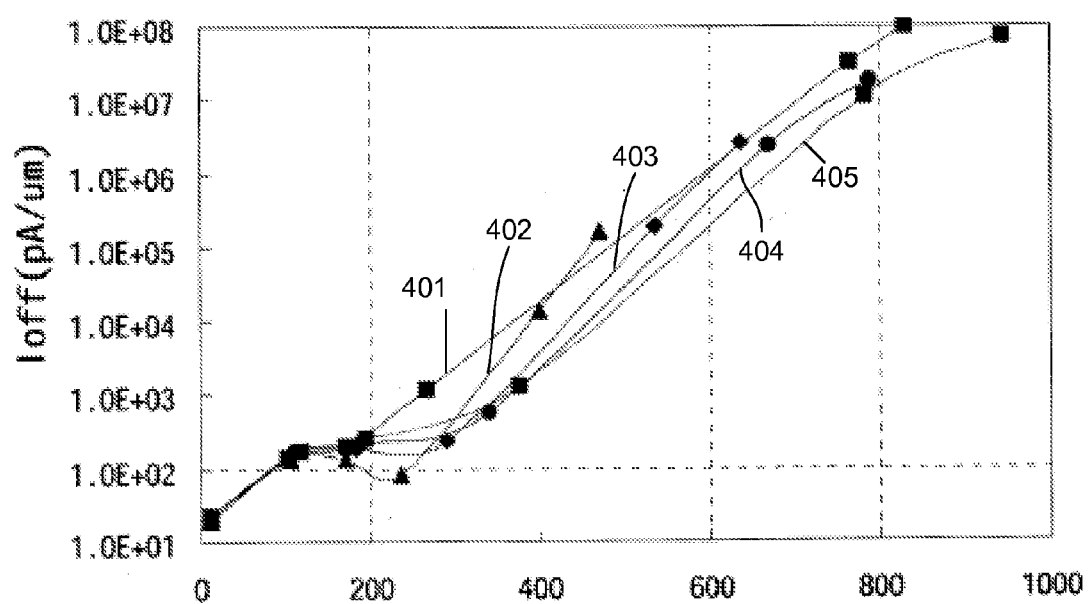
FIG. 4 is a plot of Ioff plotted against Isat according to an embodiment of the present invention.

FIG. 4 is a plot of Ioff against Isat or universal curves according to an embodiment of the present invention. This diagram is merely an example and should not unduly limit the scope of the claims herein. One of ordinary skill in the art would recognize many variations, modifications, and alternatives. As shown, using IEDF with energies of 50 eV and 500 eV for nLDD implant improves short channel performance for NMOS devices. The heavier the implant dose with 50 eV implant energy is, the better the improvement in the universal curves. In an alternate embodiment, FIG. 4 indicates that IEDF for pLDD implant condition with energy of 50 eV and 500 eV can also improve the device performance for PMOS. However, this improvement is quite different for NMOS and for PMOS devices. The main improvement in PMOS devices comes from leakage reduction while for NMOS devices, the improvement primarily comes from higher drive current.

As shown in FIG. 4, the x-axis the saturation current and the y-axis represents the leaking current of the improved NMOS device. Curve 401 is the result of the leakage current Ioff vs. the saturation current Isat for an implanted dose of 1.5E15 with the energy of 2 keV. Curve 402 is for an implanted dose of 1.0E15 with 500 eV. Curve 403 is the result obtained using a combination of an implanted dose of 1.0E15 with 500 eV and another one of 1E15 with 50 eV. Curve 404 is the result obtained using an implanted dose of 1.0E15 with 500 eV and another dose of 2.0E15 with 50 eV. Curve 405 is the result obtained using an implanted dose of 1.0E15 with 500 eV and another dose 3.0E15 with 50 eV. It is noted that the heavier the implanted dose with 50 eV implant energy is, the better performance is for the universal curves.

Figure 5:
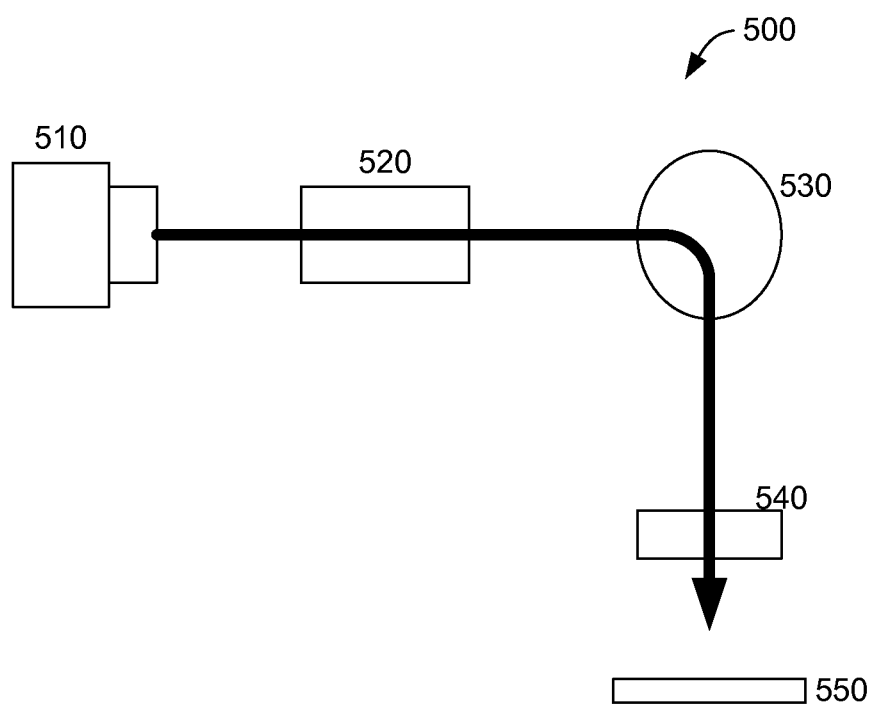
FIG. 5 is a simplified diagram of a conventional implantation process.

FIG. 5 is a simplified diagram of a conventional implantation apparatus 500. Apparatus 500 includes an ion source 510 configured to generate an ion beam, an accelerator 520 configured to accelerate the ion beam using an electrical field, and an ion deflector 530 that steers the ion beam in a desired direction. Apparatus 500 may include an electrostatic lens 540 configured to focus the deflected ion beam onto a semiconductor substrate or wafer 550. The conventional ion implementation process requires an adjustment of apparatus 500 every time a different implantation energy is needed, for example, by readjusting the accelerator. This process is cumbersome and slows down the manufacturing process.

Figure 6:
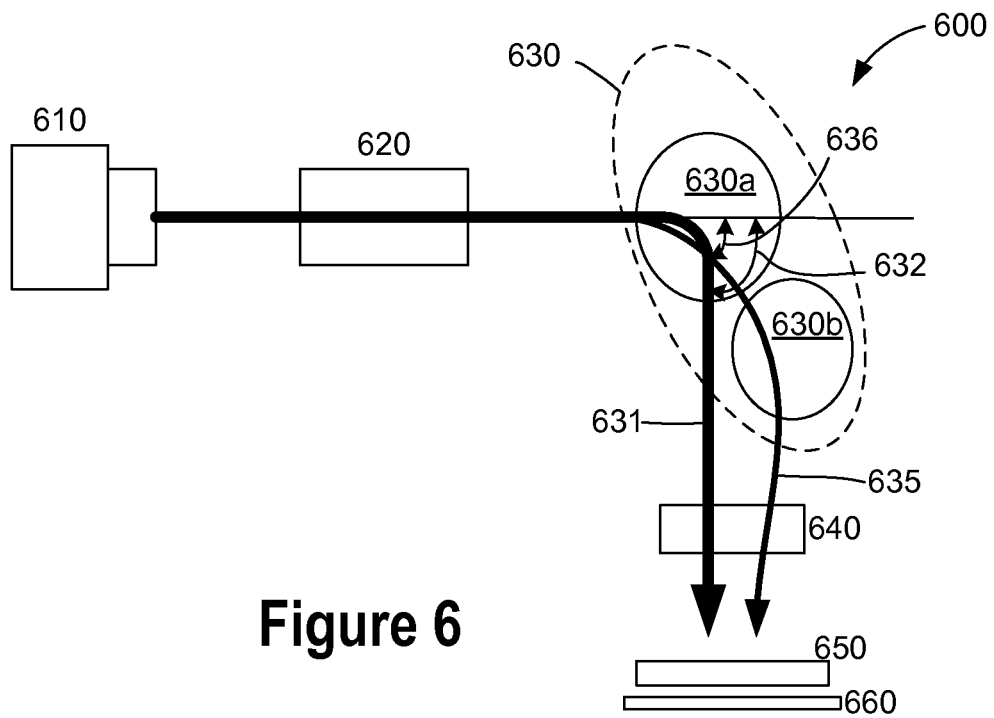
FIG. 6 is a simplified diagram of an implantation apparatus according to an embodiment of the present invention.

FIG. 6 is a simplified diagram of an implantation apparatus 600 according to an embodiment of the present invention. This diagram is merely an example and should not unduly limit the scope of the claims herein. One of ordinary skill in the art would recognize many variations, modifications, and alternatives. Dual energy can be provided by a low energy magnetic deflector. Implanting apparatus 600 includes an ion source 610 configured to generate ions of a selected species and an accelerator 620 configured to accelerate the ions of the selected species. Apparatus 600 further includes a magnetic structure 630 configured to deflect the accelerated ions towards a silicon wafer 650 having a surface region. Magnetic structure comprises a magnetic deflector 630a configured to deflects a first portion 631 of the accelerated ions towards wafer 650 at a first deflected angle 632 and a low-energy magnetic deflector 630b configured to deflect a second portion 635 of the accelerated ions towards wafer at a second deflected angle 636; the first and second portions of the accelerated ions travels in the same direction. In an embodiment, first deflected angle 632 is greater than second deflected angle 636. In another embodiment, the same direction is perpendicular to the surface region of the silicon wafer.

In addition, apparatus 600 may include a support mechanism 660 for supporting wafer 650 and for positioning wafer 650 to intercept the first and second portions of the accelerated ions. In an embodiment, apparatus 600 may include a focus structure 640 interposed between magnetic structure 630 and wafer 650, the focus structure is configured to distribute the first and second portions of the accelerated ions homogeneously across wafer 650. In an embodiment, implanting apparatus 600 implants ions to the surface of the silicon wafer in the order of $15^{th}$ power of atoms per unit area, that is, 1.0E15 atoms per $cm^2$. The ion energy is set to a value in the range of 500 eV for the first portion and 50 eV for the second portion of the accelerated ions. In an embodiment, the ions of the selected species may be boron or the like. In another embodiment, the ions of the selected species can be phosphorous, arsenic, or antimony.

Figure 7:
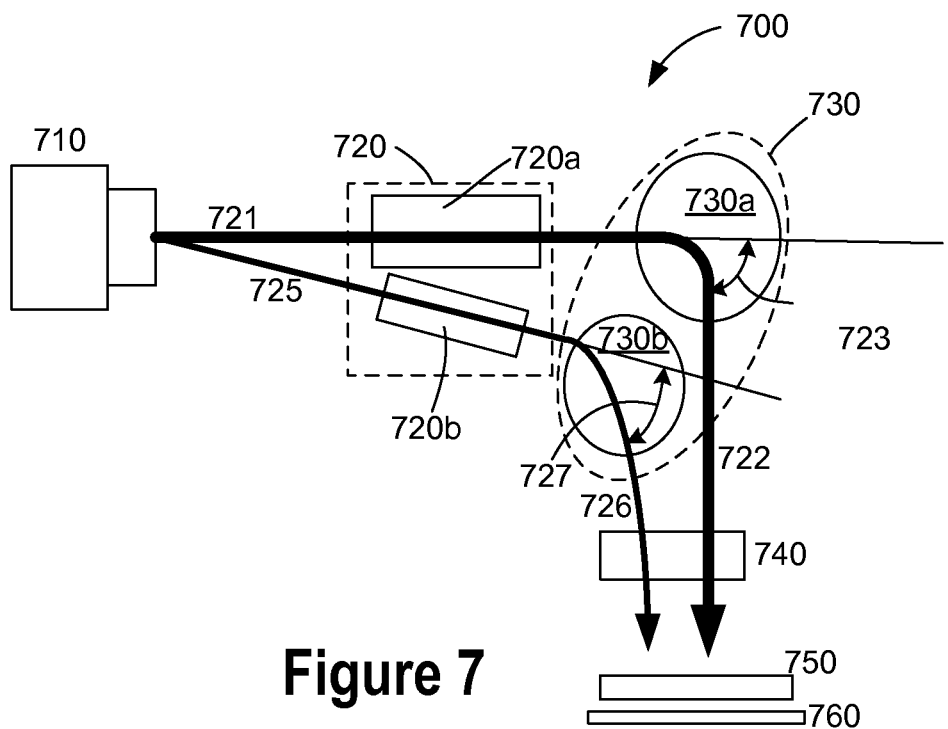
FIG. 7 is a simplified diagram of an implantation apparatus according to another embodiment of the present invention.

FIG. 7 is a simplified diagram of an implantation apparatus 700 according to another embodiment of the present invention. This diagram is merely an example and should not unduly limit the scope of the claims herein. One of ordinary skill in the art would recognize many variations, modifications, and alternatives. Dual energy can be provided by an addition of a low energy accelerator. Ion implanting apparatus 700 includes an ion source 710 configured to generate ions of a selected species and an accelerator structure 720 configured to accelerate the ions of the selected species. In an embodiment, accelerator structure 720 includes a main accelerator 720a configured to accelerate a first portion 721 of the generated ions with a first energy and a low-energy accelerator 720b configured to accelerate a second portion 725 of the generated ions with a second energy. Apparatus 700 further includes a magnetic structure 730 having a first magnetic deflector 730a configured to deflect first portion 721 of the generated ions into a first path trajectory 722 towards a silicon wafer 750 having a surface region and a second magnetic deflector 730b configured to deflect second portion 725 of the generated ions into a second path trajectory 726 toward silicon wafer 750, i.e., first path trajectory 722 and second path trajectory 726 travel in the same direction, which is perpendicular to the surface region of silicon wafer 750. In an embodiment, the first magnetic deflector 730a deflects first path trajectory 722 with a first trajectory angle 723 and second magnetic deflector 730b deflects second path trajectory 726 with a second trajectory angle 727, wherein first angle 723 is greater than second angle 727.

In addition, apparatus 700 may include a support mechanism 760 for supporting wafer 750 and for positioning wafer 750 to intercept the first and second portions of the accelerated ions. In an embodiment, apparatus 700 may include a focus structure 740 interposed between magnetic structure 730 and wafer 750, the focus structure is configured to distribute the first and second portions of the accelerated ions homogeneously across wafer 750. In an embodiment, the first energy is in the range about 50 eV, and the second energy is ranging about 500 eV.

Figure 8A:
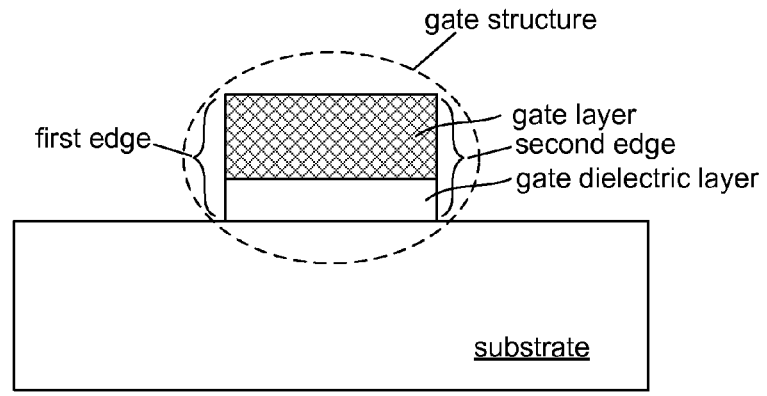
FIG. 8A is a simplified cross-sectional view of a semiconductor substrate having a gate dielectric layer formed on the substrate and a gate layer formed on the gate dielectric layer according to an embodiment of the present invention.
Figure 8B:
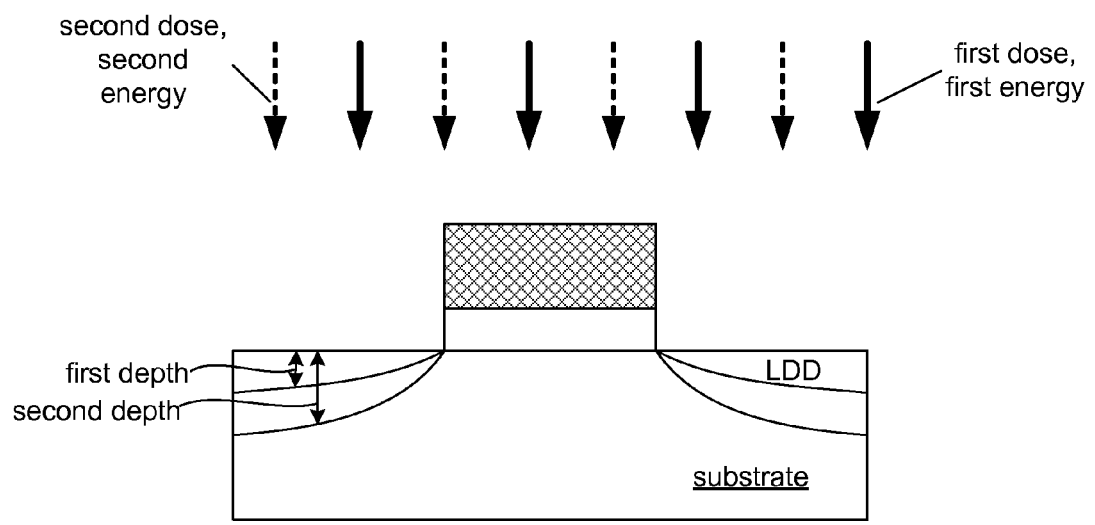
FIG. 8B is a simplified cross-sectional view of multiple ion beams being simultaneously implanted with different energies into the semiconductor substrate using a gate structure of FIG. 8A as a mask, in accordance with an embodiment of the present invention.

FIGS. 8A and 8B illustrate an application of the apparatus and methods described above. FIG. 8A is a simplified cross-sectional view of a semiconductor substrate having a gate dielectric layer formed on the substrate and a gate layer formed on the gate dielectric layer according to an embodiment of the present invention. FIG. 8B is a simplified cross-sectional view of multiple ion beams being simultaneously implanted with different energies into the semiconductor substrate using a gate structure of FIG. 8A as a mask, in accordance with an embodiment of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for implanting ions of a selected species into a semiconductor wafer comprising:
    an ion source configured to generate a first portion of ions with a first ion trajectory and a second portion of ions with a second ion trajectory different from the first ion trajectory;
    an accelerator structure comprising a first accelerator and a second accelerator, the first accelerator configured to accelerate the first portion of ions with a first energy, the second accelerator configured to accelerate the second portion of ions with a second energy, the first energy being different from the second energy; and
    a magnetic structure comprising a first magnetic deflector having a first strength configured to deflect the first portion of the accelerated ions into a first path trajectory and a second magnetic deflector having a second strength configured to deflect the second portion of the accelerated ions into a second path trajectory, the first magnetic deflector being different from the second deflector;
    wherein the first portion of the accelerated ions enters the magnetic structure at a first entry point and the second portion of the accelerated ions enters the magnetic structure at a second entry point different from the first entry point.

2. The apparatus of claim 1 wherein the first path trajectory includes a first path angle and the second path trajectory includes a second path angle, wherein the first path angle is greater than the second path angle.

3. The apparatus of claim 1 wherein the first and second path trajectories have a same incident angle relative to a surface region of the semiconductor wafer.

4. The apparatus of claim 3 wherein the same incident angle is perpendicular to the surface of the semiconductor wafer.

5. The apparatus of claim 1 wherein the first energy is greater than the second energy.

6. The apparatus of claim 1 wherein the first and second magnetic deflectors are configured to:
concurrently deflect the first accelerated portion of ions into a first path trajectory having a first deflected angle and the second accelerated portion of ions into a second path trajectory having a second deflected angle;
wherein the first deflected angle is greater than the second deflected angle; and
wherein the first and second deflected path trajectories travel in a same direction relative to the surface of the semiconductor wafer.

7. The apparatus of claim 1 wherein the second energy is about 10 times higher than the first energy.

8. The apparatus of claim 1 wherein the first energy is about 50 eV and the second energy is about 500 eV.

9. The apparatus of claim 1 wherein the generated ions comprise n-type dopants.

10. The apparatus of claim 1 wherein the generated ions comprise p-type dopants.

11. The apparatus of claim 1 wherein the generated ions are selected from the group consisting of phosphorous (P), arsenic (As), and antimony (Sb).

12. The apparatus of claim 1 wherein the generated ions comprise boron.

13. The apparatus of claim 12 further comprising:
a support mechanism configured to support the semiconductor wafer.

14. The apparatus of claim 1 wherein the first and second accelerators are separated from each other.

15. The apparatus of claim 1 further comprising:
a focus structure disposed between the magnetic structure and the semiconductor wafer, the focus structure being configured to distribute the first and second portions of the accelerated ions homogeneously across the semiconductor wafer.

16. The apparatus of claim 1 wherein the first portion of the accelerated ions enters the semiconductor wafer at a first depth and the second portion of the accelerated ions enters the semiconductor wafer at a second depth, the first depth being different from the second depth.

* * * * *